(12) United States Patent
Chih

(10) Patent No.: US 6,605,973 B1
(45) Date of Patent: Aug. 12, 2003

(54) HIGH VOLTAGE DISCHARGE CIRCUIT

(75) Inventor: Yue-der Chih, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/099,214

(22) Filed: Mar. 15, 2002

(51) Int. Cl.[7] .................................................. H03K 5/08
(52) U.S. Cl. ...................................................... 327/309
(58) Field of Search ................................ 327/309, 310, 327/313, 314, 318, 319, 320, 321, 324, 325, 327, 328, 333

(56) References Cited

U.S. PATENT DOCUMENTS

| | | | |
|---|---|---|---|
| 5,289,025 A | 2/1994 | Lee | ............................ 257/299 |
| 5,510,746 A * | 4/1996 | Tanoi | ........................... 327/427 |
| 5,767,729 A | 6/1998 | Song | ........................... 327/390 |
| 6,011,409 A | 1/2000 | Huang et al. | .................. 326/83 |
| 6,232,805 B1 * | 5/2001 | Brandt | ........................ 327/108 |

* cited by examiner

Primary Examiner—Jeffrey Zweizig
(74) Attorney, Agent, or Firm—George O. Saile; Stephen B. Ackerman

(57) ABSTRACT

This invention provides a circuit and a method for discharging a high voltage to ground level from a circuit node especially in intergrated circuits. The invention relates to a high voltage discharge circuit which prevents semiconductor latch-up and prevents semiconductor damage during the discharge process. In addition, the discharge process takes a short amount of time. A feedback mechanism from the drains of the FETs through inverters back to gate #2 of the dual-gated FETs causes the individual drains of series connected FETs to discharge rapidly. The discharge mechanism of this invention minimizes the voltage times current power and therefore protects the integrated devices from damage.

26 Claims, 1 Drawing Sheet

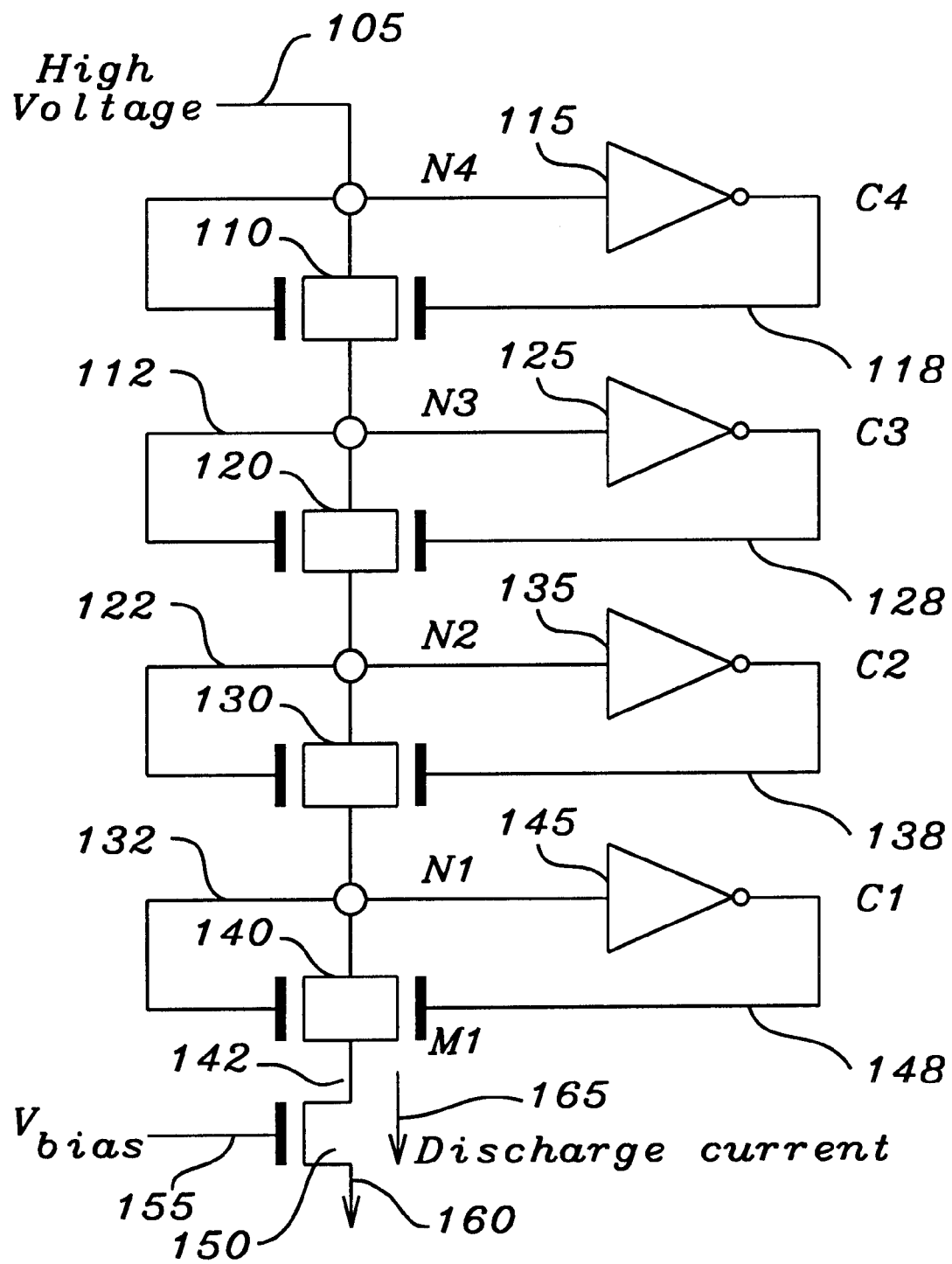

HIGH VOLTAGE DISCHARGE CIRCUIT

BACKGROUND OF THE INVENTION

1. Field of the Invention

This invention relates to a circuit and a method for discharging high voltage nodes to ground.

More particularly this invention relates to a high voltage discharge circuit which prevents semiconductor latch-up and prevents semiconductor damage during the discharge process.

2. Description of Related Art

Integrated circuits typically are made up of electrically alterable memory and flash memory. For the program and erase operations of these writable memories, an internal high voltage is needed. For example, there are high voltages on some internal nodes of flash memories during program and erase operations. These high-voltage nodes have to be carefully discharged to ground after the program or erase operations are completed. These high voltages must be discharged. If they are allowed to persist in the high density integrated circuit chip environment, the devices could latch-up or could be damaged.

The typical prior art circuit for discharging on-chip high voltages consists of a serial connection of N channel metal oxide semiconductor field effect transistors, NMOS FETs. This serial path of NMOS FETs will discharge the high voltage in a timely fashion and without damage to the serial FETs themselves. However, this prior art circuit can only discharge the high voltage down to a voltage of N times the threshold voltage of an NMOS device, Vt. In the example of 4 serially connected NMOS FETs discharging the high voltage, the resultant voltage level would be approximately 4 times 0.6 volts or 2.4 volts.

Similarly, in a prior art discharge circuit which has an NMOS load device connected in series with another NMOS discharge device, the high voltage can be discharged close to ground. However, with only one discharge device, the discharge current must be kept small due to the large high discharge voltage at the drain of the NMOS FET device. If the NMOS load device has a large current and a large discharge voltage, the NMOS FETs can be damaged. Therefore, in this second prior art circuit, the discharge current must be reduced. The reduced discharge current will produce a slow discharge circuit.

U.S. Pat. No. 5,289,025 (Lee) "Integrated Circuit Having a Boosted Node" describes a circuit to allow connection of a MOS transistor source/drain region to a voltage boosted above the main power supply. Typical uses include clock driver circuits in microprocessors, row lines in dynamic and static memory chips, and substrate bias generators.

U.S. Pat. No. 5,767,729 (Song) "Distribution Charge Pump for Nonvolatile Memory Device" describes a charge pump circuit for a nonvolatile memory, such as an EEPROM. The voltage on an internal node capacitance progressively rises over subsequent clock pulses until the node reaches a boosted voltage level which is higher than the power supply voltage.

U.S. Pat. No. 6,011,409 (Huang et al.) "Input/Output Buffer Capable of Accepting An Input Logic Signal Higher in Voltage Level Than the System Voltage" discloses an I/O circuit capable of accepting a voltage exceeding the chip supply.

BRIEF SUMMARY OF THE INVENTION

It is the objective of this invention to provide a circuit and a method for discharging high voltage in a short amount of time from the nodes of circuits especially integrated circuits.

It is further an object of this invention to prevent latch-up or damage of devices and circuits during the careful discharge of the high voltage to ground.

The objects of this invention are achieved by a high voltage discharge circuit which is made up of a series connected group of NMOS Field effect transistors FETs. The connection from the high voltage node to be discharged to ground via a series of four connected NMOS FETs. Inverters are connected from the drains of the NMOS FETs to the gates of the series connected NMOS FETs, which have two gates for each FET device. The input of the inverters are connected to the drains of the four series connected FETs and the output of the inverters is connected to gate #1 of the four dual-gated FETs. The drains of the four series connected FETs are connected to gate #2 of the dual-gated FETs. The drain of the first series connected FET is connected to the highest voltage node. The source of the first series connected FET is connected to the drain of the second series connected FET. The source of the second series connected FET is connected to the drain of the third series connected FET. The source of the third series connected FET is connected to the drain of the fourth series connected FET. The source of the fourth series connected FET is connected to the drain of a bias FET device. The source of the bias FET is connected to ground. The gate of the bias FET is connected to a voltage bias. The bias FET conducts a discharge current to ground.

BRIEF DESCRIPTION OF THE DRAWINGS

The FIGURE shows a circuit illustrating the high voltage discharge apparatus of this invention.

DETAILED DESCRIPTION OF THE INVENTION

Refer to the figure for the main circuit embodiment of this invention. The high voltage node 102 to be discharged is shown. It is connected to the top-most FET device 110, shown in a series connection of several FET devices in the FIGURE. Four of the series connected FET devices 110, 120, 130, & 140 are dual-gated FETs. They have two gate terminals per FET device. A dual-gated FET is really two transistors A and B with a common drain and a common source. One of the two transistors, A, has the common drain connected to its gate, while the other of the two transistors, B, has its gate connected to an outside logic signal. Transistor A is a diode-connected FET, while Transistor B is a logical switch NMOS FET.

The bottom-most dual-gated FET device 140 in the FIGURE has its source 142 connected to the drain of a single gated bias FET 150. The gate of this bias FET 155 is connected to a bias voltage, Vbias. The source of the bias FET is connected to ground 160. The current through the bias FET 150 is the discharge current 165.

The drain of the first dual-gated FET 140 is connected to the source of the second dual-gated FET 130. The drain of the first dual-gated FET 140 is also connected to the first gate 132 of this first FET 140. The drain of the first dual-gated FET 140 is also connected to the input of an inverter 145. The output of this inverter 145 is connected to the second gate 148 of the dual-gated FET 140:

The drain of the second dual-gated FET 130 is connected to the source of the third dual-gated FET 120. The drain of the second dual-gated FET 130 is also connected to the first gate 122 of this second FET 130. The drain of the second dual-gated FET 130 is also connected to the input of an inverter 135. The output of this inverter 135 is connected to the second gate 138 of the dual-gated FET 130.

The drain of the third dual-gated FET 120 is connected to the source of the fourth dual-gated FET 110. The drain of the third dual-gated FET 120 is also connected to the first gate 112 of this third FET 120. The drain of the third dual-gated FET 120 is also connected to the input of an inverter 125. The output of this inverter 125 is connected to the second gate 128 of the dual-gated FET 120.

The drain of the fourth dual-gated FET 110 is connected to the high voltage node to be discharged 102. The drain of the fourth dual-gated FET 110 is also connected to the first gate 102 of this fourth FET 110. The drain of the fourth dual-gated FET 110 is also connected to the input of an inverter 115. The output of this inverter 115 is connected to the second gate 118 of the dual-gated FET 110.

In this high voltage discharge circuit, the lower voltage caused by the voltage discharging on the drain 142 of the single-gated bias FET 150 causes the first dual-gated FET to turn on. This occurs since the drain 142 of the single-gated bias FET 150 is the same node 142 as the source of the first dual-gated FET 140. Lowering the voltage at the source 142 of dual-gated FET 140 causes the Vgs, gate to source to exceed the FET threshold voltage, Vt. This results in the turning ON of FET 140 and the discharging of the voltage on the drain 132 of the first dual-gated FET 140.

In this high voltage discharge circuit, the lower voltage caused by the voltage discharging on the drain 132 of the first dual-gated FET 140 causes the output 148 of the first inverter 145 to go high further discharging the drain 132 of the first dual-gated FET 140.

In this high voltage discharge circuit, the lower voltage caused by the voltage discharging on the drain 132 of the dual-gated bias FET 140 causes the second dual-gated FET 130 to turn ON. This occurs since the drain 132 of the first dual-gated bias FET 140 is the same node 132 as the source of the second dual-gated FET 130. Lowering the voltage at the source 132 of dual-gated FET 130 causes the Vgs, gate to source to exceed the FET threshold voltage, Vt. This results in the turning ON of FET 130 and the discharging of the voltage on the drain 122 of the second dual-gated FET 130.

In this high voltage discharge circuit, the lower voltage caused by the voltage discharging on the drain 122 of the second dual-gated FET 130 causes the output 138 of the second inverter 135 to go high further discharging the drain 122 of the second dual-gated FET 130.

In this high voltage discharge circuit, the lower voltage caused by the voltage discharging on the drain 122 of the dual-gated bias FET 130 causes the third dual-gated FET 120 to turn ON. This occurs since the drain 122 of the second dual-gated bias FET 130 is the same node 122 as the source of the third dual-gated FET 120. Lowering the voltage at the source 122 of dual-gated FET 120 causes the Vgs, gate to source to exceed the FET threshold voltage, Vt. This results in the turning ON of FET 120 and the discharging of the voltage on the drain 112 of the third dual-gated FET 120.

In this high voltage discharge circuit, the lower voltage caused by the voltage discharging on the drain 112 of the third dual-gated FET 120 causes the output 128 of the third inverter 125 to go high further discharging the drain 112 of the third dual-gated FET 120.

In this high voltage discharge circuit, the lower voltage caused by the voltage discharging on the drain 112 of the dual-gated bias FET 120 causes the fourth dual-gated FET 110 to turn ON. This occurs since the drain 112 of the third dual-gated bias FET 120 is the same node 112 as the source of the fourth dual-gated FET 110. Lowering the voltage at the source 112 of dual-gated FET 110 causes the Vgs, gate to source to exceed the FET threshold voltage, Vt. This results in the turning ON of FET 110 and the discharging of the voltage on the drain 102 of the fourth dual-gated FET 110. This drain 102 is also the high voltage node to be discharged.

In this high voltage discharge circuit, the lower voltage caused by the voltage discharging on the drain 102 of the fourth dual-gated FET 110 causes the output 118 of the fourth inverter 115 to go high further discharging the drain 102 of the fourth dual-gated FET 110.

The key advantage of the circuit of this invention over the prior art is that it can discharge a high voltage to ground, not to a voltage of N times the Vt, threshold voltage where N are the number of serial connected NMOS FET discharge devices connected in series to ground. The circuit of this invention can achieve the discharging of high voltage to ground, because the inverter logic circuits connected from the drains to the gates of transistor B of the dual-gated NMOS devices allow the voltage to discharge to ground off of the intermediate nodes 112, 122, 132, 142 of the serially connected NMOS FETs in the figure.

The discharging of the high voltage through the four dual-gated FETs and the single gated bias FET takes a relatively short time, since the feedback path from the drains of the dual-gated FETs through an inverter back to gate #2 of the dual-gated FET causes a rapid pull down of the voltage from the drains of each of the series connected dual-gated FETs. In addition, beside the short time it takes to discharge a high voltage from a node, another advantage of this invention is that during discharge, the drain to source voltage Vds, of each NMOS device in the series chain is small {Vds<(High Voltage/4)}. Therefore, latch-up or damage to the individual FETs will not occur.

While this invention has been particularly shown and described with Reference to the preferred embodiments thereof, it will be understood by those Skilled in the art that various changes in form and details may be made without Departing from the spirit and scope of this invention.

What is claimed is:

1. A high voltage discharge circuit comprising:
   a dual-gate element having a first and second NMOS transistor each said transistor having gate, drain, and source wherein said drains and said first gate are commonly coupled to a first node and wherein said sources are commonly coupled,
   an inverter having its input coupled to said first node and output coupled to said second gate, and
   a current source between said commonly coupled sources and a second node wherein said circuit is capable of discharging a high voltage or said first node through said second node.

2. The high voltage discharge circuit of claim 1 further comprising:
   at least one additional dual gate element and said inverter coupled between said first node and said gate current source.

3. The high voltage discharge circuit of claim 1 further comprising:
   inverters connected from the drains of the NMOS FETs to the gates of said series connected NMOS FETs.

4. The high voltage discharge circuit of claim 1 further comprising:
   said series connected FETs having two gates for each FET device.

5. The high voltage discharge circuit of claim 3 wherein the input of said inverters are connected to the drains of said series connected FETs and the output of said inverters is connected to gate #1 of said FETs.

6. The high voltage discharge circuit of claim 3 wherein the drains of said series connected FETs are connected to gate #2 of said series connected FETs.

7. The high voltage discharge circuit of claim 3 wherein the drain of the first series connected FET is connected to the highest voltage node.

8. The high voltage discharge circuit of claim 3 wherein the source of the first series connected FET is connected to the drain of the second series connected FET.

9. The high voltage discharge circuit of claim 3 wherein the source of the second series connected FET is connected to the drain of the third series connected FET.

10. The high voltage discharge circuit of claim 3 wherein the source of the third series connected FET is connected to the drain of the fourth series connected FET.

11. The high voltage discharge circuit of claim 3 wherein the source of the fourth series connected FET is connected to the drain of a bias FET device.

12. The high voltage discharge circuit of claim 3 wherein the source of said bias FET is connected to ground.

13. The high voltage discharge circuit of claim 3 wherein the gate of said bias FET is connected to a voltage bias.

14. The high voltage discharge circuit of claim 3 wherein said bias FET conducts a discharge current to ground.

15. A high voltage discharge circuit comprising:

a bias FET which discharges four series connected dual-gated FETs to ground, wherein said four series connected dual-gated FETs have an inverter connected from said FETs' drain to one of said FETs' gates and wherein said four series connected dual-gated FETs cause a high voltage node to discharge quickly and wherein the drain to source voltages on said four series connected dual-gated FETs are kept low during the discharge operation preventing device damage.

16. The high voltage discharge circuit of claim 15 wherein the series connected dual-gated FETs comprise a first dual gate FET which discharges its drain to a lower voltage and whose source is connected to a drain of said bias FET.

17. The high voltage discharge circuit of claim 16 wherein said low voltage caused by said discharge on the drain of the first dual-gated FET causes the output of an inverter to go high further discharging the first dual-gated FET.

18. The high voltage discharge circuit of claim 16 wherein the series connected dual-gated FETs further comprise a second dual-gated FET which discharges its drain to a lower Voltage and whose source is connected to a drain of said first dual-gated FET.

19. The high voltage discharge circuit of claim 18 wherein said low voltage caused by said discharge on the drain of the second dual-gated FET causes the output of a second inverter to go high further discharging the second dual-gated FET.

20. The high voltage discharge circuit of claim 18 wherein the series connected dual-gated FETs further comprise a third dual-gated FET which discharges its drain to a lower voltage and whose source is connected to a drain of said second dual-gated FET.

21. The high voltage discharge circuit of claim 20 wherein said low voltage caused by said discharge on the drain of the third dual-gated FET causes the output of a third inverter to go high further discharging the third dual-gated FET.

22. The high voltage discharge circuit of claim 20 wherein the series connected dual-gated FETs further comprise a fourth dual-gated FET which discharges its drain to a lower voltage and whose source is connected to a drain of said third dual-gated FET.

23. The high voltage discharge circuit of claim 22 wherein said low voltage caused by said discharge on the drain of the fourth dual-gated FET causes the output of a fourth inverter to go high further discharging the fourth dual-gated FET.

24. A method of discharging high voltage from an internal node of an integrated circuit comprising the steps of:

connecting a dual-gate element having a first and second NMOS transistor each said transistor having gate, drain, and source wherein said drains and said first gate are commonly coupled to a first node and wherein said sources are commonly coupled, connecting an inverter having its input coupled to said first node and output coupled to said second gate, and connecting a current source between said commonly coupled sources and a second node wherein said circuit is capable of discharging a high voltage or said first node through said second node.

25. The method of discharging high voltage from an internal node of an integrated circuit of claim 24 further comprising the steps of:

connecting the first dual-gated FET's source to the drain of a bias FET, connecting the drain of the bias FET to ground, connecting the gate of the bias FET to a bias voltage, connecting the first dual-gated FET's drain to the source of the second dual-gated FET, connecting the second dual-gated FET's drain to the source of the third dual-gated FET, connecting the third dual-gated FET's drain to the source of the fourth dual-gated FET, connecting the fourth dual-gated FET's drain to the high voltage internal node to be discharged.

26. The method of discharging high voltage from an internal node of an integrated circuit of claim 24 further comprising the steps of:

discharging the drain of the first series connected dual-gated FET using the discharge current through the series connected bias FET, discharging the drain of the second series connected dual-gated FET using the discharge current through the series combination of the series connected bias FET and the first dual-gated FET, discharging the drain of the third series connected dual-gated FET using the discharge current through the series combination of the series connected bias FET, the first dual-gated FET and the second dual-gated FET, discharging the desired high voltage to be discharged which is connected to the drain of the fourth series connected dual-gated FET using the discharge current through the series combination of the series connected bias FET, the first dual-gated FET, the second dual-gated FET, and the third dual-gate FET.

* * * * *

UNITED STATES PATENT AND TRADEMARK OFFICE
CERTIFICATE OF CORRECTION

PATENT NO. : 6,605,973 B1  
DATED : August 12, 2003  
INVENTOR(S) : Yue-Der Chih It is certified that error appears in the above-identified patent and that said Letters Patent is hereby corrected as shown below:

<u>Title page,</u>
Item [75], delete "Yue-der Chih", and replace with -- Yue-Der Chih --.

Signed and Sealed this

Thirteenth Day of January, 2004

JON W. DUDAS
*Acting Director of the United States Patent and Trademark Office*